(12) United States Patent
Kurosawa et al.

(10) Patent No.: US 10,066,096 B2
(45) Date of Patent: Sep. 4, 2018

(54) METHOD OF PRODUCING STRUCTURE CONTAINING PHASE-SEPARATED STRUCTURE AND RESIN COMPOSITION FOR FORMING PHASE-SEPARATED STRUCTURE

(71) Applicant: TOKYO OHKA KOGYO CO., LTD., Kawasaki-shi (JP)

(72) Inventors: Tsuyoshi Kurosawa, Kawasaki (JP); Tasuku Matsumiya, Kawasaki (JP); Masahito Yahagi, Kawasaki (JP); Hitoshi Yamano, Kawasaki (JP); Ken Miyagi, Kawasaki (JP); Daiju Shiono, Kawasaki (JP); Taku Hirayama, Kawasaki (JP); Katsumi Ohmori, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/076,097

(22) Filed: Mar. 21, 2016

(65) Prior Publication Data
US 2016/0280906 A1    Sep. 29, 2016

(30) Foreign Application Priority Data

Mar. 27, 2015    (JP) ................ 2015-067290

(51) Int. Cl.
| | | |
|---|---|---|
| *G03F 7/00* | (2006.01) | |
| *B32B 3/18* | (2006.01) | |
| *C09D 125/04* | (2006.01) | |
| *C09D 153/00* | (2006.01) | |
| *C08L 53/00* | (2006.01) | |
| *C08L 33/12* | (2006.01) | |

(Continued)

(52) U.S. Cl.
CPC ............... *C08L 53/00* (2013.01); *C08L 33/12* (2013.01); *C09D 133/12* (2013.01); *C09D 153/00* (2013.01); *G03F 7/0002* (2013.01); *B82Y 40/00* (2013.01)

(58) Field of Classification Search
CPC .......... C08L 25/04; C08L 33/12; C08L 53/00; C09D 125/04; C09D 133/12; C09D 153/00; B32B 3/18; G03F 7/0002
USPC ....................................... 525/95, 96
See application file for complete search history.

(56) References Cited

U.S. PATENT DOCUMENTS

| | | | | |
|---|---|---|---|---|
| 2009/0240001 A1* | 9/2009 | Regner | ................... | B05D 1/34 525/95 |
| 2013/0189504 A1* | 7/2013 | Nealey | ................... | B82Y 30/00 428/201 |
| 2014/0065379 A1* | 3/2014 | Nealey | ................. | G03F 7/0002 428/195.1 |

FOREIGN PATENT DOCUMENTS

JP    2008-036491 A    2/2008

OTHER PUBLICATIONS

Mayes et al. Macromolecules 1992, 25, 6523-6531.*

(Continued)

*Primary Examiner* — Vu A Nguyen
(74) *Attorney, Agent, or Firm* — Knobbe Martens Olson & Bear LLP

(57) ABSTRACT

A method of producing a structure containing a phase-separated structure, which includes mixing a block copolymer which includes a hydrophobic polymer block and a hydrophilic polymer block and is incapable of forming a phase-separated structure, with a homopolymer compatible with the hydrophilic polymer block or a homopolymer compatible with the hydrophobic polymer block.

4 Claims, 2 Drawing Sheets

(51) Int. Cl.
*C09D 133/12* (2006.01)
*B82Y 40/00* (2011.01)

(56) References Cited

OTHER PUBLICATIONS

Jeong et al. Macromolecules 2003, 36, 3626-3634.*
Khaydarov et al. (European Polymer Journal 43 (2007) 789-796).*
Junhan Cho, Macromolecules 2000, 33, 2228-2241.*
Hinsberg et al., Self-Assembling Materials for Lithographic Patterning; Overview, Status and Moving Forward, Proceedings of SPIE, vol. 7637, 76370G-1, 2010.

* cited by examiner

METHOD OF PRODUCING STRUCTURE CONTAINING PHASE-SEPARATED STRUCTURE AND RESIN COMPOSITION FOR FORMING PHASE-SEPARATED STRUCTURE

CROSS-REFERENCE TO RELATED APPLICATIONS

This application claims priority to Japanese Patent Application No. 2015-067290, filed Mar. 27, 2015, the content of which is incorporated herein by reference.

BACKGROUND OF THE INVENTION

Field of the Invention

The present invention relates to a method of producing a structure containing a phase-separated structure and a resin composition for forming the phase-separated structure.

Background Art

Recently, as further miniaturization of large scale integrated circuits (LSI) proceeds, a technology for processing a more delicate structure is demanded. In response to such demand, attempts have been started on forming a fine pattern using a phase-separated structure formed by self-assembly of block copolymers having mutually incompatible blocks bonded together. (For example, see Japanese Unexamined Patent Application, Publication No. 2008-36491).

For using a phase-separated structure of a block copolymer, it is necessary to form a self-organized nano structure by a microphase separation only in specific regions, and arrange the nano structure in a desired direction. For realizing position control and orientational control, processes such as graphoepitaxy to control phase-separated pattern by a guide pattern and chemical epitaxy to control phase-separated pattern by difference in the chemical state of the substrate are proposed (see, for example, Proceedings of SPIE, vol. 7637, pp. 76370G-1 (2010)).

A block copolymer forms a regular periodic structure by phase separation. The periodic structure changes to a cylinder, a lamellar or a sphere, depending on the volume ratio or the like of the polymer components. Further, it is known that the period depends on the molecular weight.

SUMMARY OF THE INVENTION

Various demands for the position control and the orientational control of the self-organized nano structure which is formed by the microphase separation tend to be increased. Thus, a method for controlling the phase-separated structure to be a desired structure is needed.

Control of the phase-separated structure is achieved by precise polymerization control for the block copolymer in the related art. However, in the present polymerization technology, it is difficult to obtain a desired block copolymer, and a situation in which yield is very low occurs. In addition, if a block copolymer in which forming the phase-separated structure is impossible is produced, the produced block copolymer is useless and required to be discarded, and there is no means for relieving the block copolymer.

The present invention takes the above circumstances into consideration, with an object of providing a method of producing a structure which contains a phase-separated structure and can control the phase-separated structure to be a desired structure.

A first aspect of the present invention is a method of producing a structure containing a phase-separated structure. The method of producing a structure containing a phase-separated structure includes mixing a block copolymer, which includes a hydrophobic polymer block and a hydrophilic polymer block and is incapable of forming a phase-separated structure, with a homopolymer compatible with the hydrophilic polymer block or a homopolymer compatible with the hydrophobic polymer block.

A second aspect of the present invention is a resin composition for forming a phase-separated structure. The resin composition for forming a phase-separated structure includes a block copolymer, which includes a hydrophobic polymer block and a hydrophilic polymer block and is incapable of forming a phase-separated structure, and a homopolymer compatible with the hydrophilic polymer block or a homopolymer compatible with the hydrophobic polymer block.

In the present description and claims, the term "aliphatic" is a relative concept used in relation to the term "aromatic", and defines a group or a compound that has no aromaticity.

The term "alkyl group" includes a linear, branched or cyclic, monovalent saturated hydrocarbon, unless otherwise specified. The same applies for the alkyl group within an alkoxy group.

The term "alkylene group" includes a linear, branched or cyclic, divalent saturated hydrocarbon group, unless otherwise specified.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group is substituted with a fluorine atom.

The term "structural unit" refers to a monomer unit that contributes to the formation of a polymeric compound (resin, polymer, copolymer).

A "structural unit derived from an acrylic ester" refers to a structural unit that is formed by the cleavage of the ethylenic double bond of an acrylic ester.

An "acrylic ester" refers to a compound in which the terminal hydrogen atom of the carboxy group of acrylic acid ($CH_2=CH-COOH$) is substituted with an organic group.

With respect to the acrylic ester, the hydrogen atom bonded to the carbon atom present on the α-position may be substituted with a substituent. The substituent that may substitute the hydrogen atom bonded to the carbon atom present on the α-position is an atom other than a hydrogen atom or a group, and examples thereof include an alkyl group having 1 to 5 carbon atoms, a halogenated alkyl group having 1 to 5 carbon atoms and a hydroxyalkyl group. A carbon atom present on the α-position in an acrylic ester refers to the carbon atom bonded to the carbonyl group, unless specified otherwise.

Hereafter, an acrylic ester having a substituent which substitutes the hydrogen atom bonded to the carbon atom present on the α-position is sometimes referred to as "α-substituted acrylic ester". Further, acrylic esters and α-substituted acrylic esters are collectively referred to as "(α-substituted) acrylic ester".

A "structural unit derived from hydroxystyrene derivative" refers to a structural unit that is formed by the cleavage of the ethylenic double bond of a hydroxystyrene derivative.

The term "hydroxystyrene derivative" includes compounds in which the hydrogen atom bonded to the carbon atom present on the α-position of hydroxystyrene is substituted with a substituent such as an alkyl group or a halogenated alkyl group; and derivatives thereof. Examples of the derivatives thereof include a hydroxystyrene derivative in which the hydrogen atom of the hydroxy group is substituted with an organic group; and a hydroxystyrene derivative which has a substituent other than a hydroxy group besides a hydroxy group on the benzene ring, each with respect to a hydroxystyrene which may have a substituent which substitutes the hydrogen atom bonded to the carbon atom present on the α-position. Here, the α-position carbon atom (carbon atom on the α-position) refers to the carbon atom which is bonded to the benzene ring of the hydroxystyrene, unless specified otherwise.

As the substituent which substitutes the hydrogen atom on the α-position carbon atom of the hydroxystyrene, the same substituents as those described above for the substituent on the α-position carbon atom of the aforementioned α-substituted acrylic ester can be mentioned.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The term "vinylbenzoic acid derivative" includes a compound in which the hydrogen atom on the α-position carbon atom of vinylbenzoic acid is substituted with a substituent such as an alkyl group or a halogenated alkyl group; and derivatives thereof. Examples of the derivatives thereof include a benzoic acid derivative in which the hydrogen atom of the carboxy group is substituted with an organic group; and a benzoic acid derivative which has a substituent (other than a hydroxy group and a carboxy group) which is bonded to the benzene ring, each with respect to vinylbenzoic acid which may have a substituent which substitutes the hydrogen atom on the α-position carbon atom. Here, the α-position carbon atom (carbon atom on the α-position) refers to the carbon atom bonded to the benzene ring in the vinyl group of vinylbenzoic acid, unless specified otherwise.

A "styrene derivative" refers to a compound in which the hydrogen atom on the α-position carbon atom of styrene is substituted with a substituent such as an alkyl group, a halogenated alkyl group or the like.

A "structural unit derived from styrene" or "structural unit derived from a styrene derivative" refers to a structural unit that is formed by the cleavage of the ethylenic double bond of styrene or a styrene derivative.

As the alkyl group as a substituent on the α-position carbon, a linear or branched alkyl group is preferable, and specific examples include a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group as the substituent on the α-position carbon atom include a group in which part or all of the hydrogen atoms of the aforementioned "alkyl group as the substituent on the α-position carbon atom" are substituted with a halogen atom. Examples of the halogen atom include a fluorine atom, a chlorine atom, a bromine atom and an iodine atom, and a fluorine atom is particularly desirable.

Specific examples of the hydroxyalkyl group as the substituent on the α-position carbon atom include groups in which part or all of the hydrogen atoms of the aforementioned "alkyl group as the substituent on the α-position carbon atom" are substituted with a hydroxy group. The number of hydroxy groups within the hydroxyalkyl group is preferably 1 to 5, and most preferably 1.

The term "exposure" is used as a general concept that includes irradiation with any form of radiation.

According to the present invention, it is possible to provide a method of producing a structure which contains a phase-separated structure and can control the phase-separated structure to be a desired structure.

DETAILED DESCRIPTION OF THE INVENTION

Figure 1:
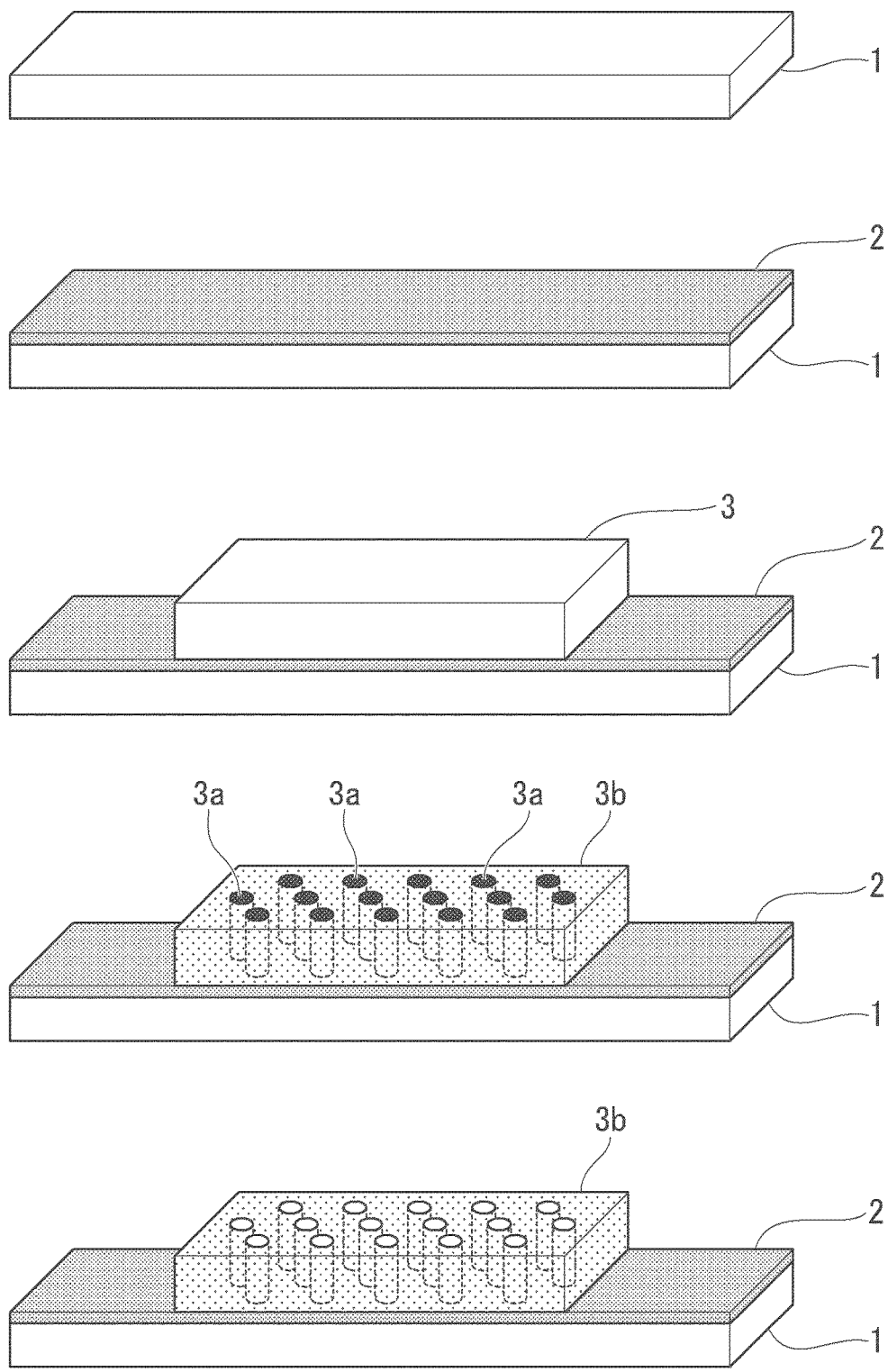
FIG. 1 is a schematic process diagram illustrating an example of an embodiment of a method of producing a structure containing a phase-separated structure, according to the present invention.

According to an aspect of the present invention, there is provided a method of producing a structure containing a phase-separated structure which includes mixing a block copolymer, which includes a hydrophobic polymer block and a hydrophilic polymer block and is incapable of forming a phase-separated structure, with a homopolymer compatible with the hydrophilic polymer block or a homopolymer compatible with the hydrophobic polymer block.

Block Copolymer

In the present invention, the block copolymer is a block copolymer which includes a hydrophobic polymer block and a hydrophilic polymer block.

The block copolymer refers to a polymeric compound obtained by bonding a plurality of partial constitutional components (blocks) in which the same type of structural unit is repeatedly bonded. In the present invention, the block copolymer may be a polymeric compound obtained by bonding a hydrophobic polymer block (also simply referred to as "a block (b11)" below) and a hydrophilic polymer block (also simply referred to as "a block (b21)" below).

For preparing the block copolymer, a plurality of monomers which have relatively different affinity with water for each of the monomers is used. The block (b11) refers to a block formed from polymers (hydrophobic polymer) in which monomers having relatively low affinity with water among the plurality of monomers are polymerized. The hydrophilic polymer block (b21) refers to a block formed from polymers (hydrophilic polymer) in which monomers having relatively high affinity with water among the plurality of monomers are polymerized.

The size or the period of a microphase separation domain is determined based on the length of a molecule of the block copolymer or the structural unit thereof.

Whether or not a microphase-separated structure is highly influenced by competition of energies such as surface energy caused by contact of different segments with each other; elastic energy caused by extension of a polymer chain; bending elastic energy, which is caused by a degree (curvature) of bending at a surface; and a balance between the blocks.

The inventors have performed an examination for whether or not the microphase-separated structure is formed, and for controlling the phase-separated structure to be a desired shape, in order to correspond to various demands for a fine pattern which is formed by the microphase-separated structure.

In the examination, the present inventors have found that, in the case of the combination of the block (b11) and the block (b21), which does not causes phase separation, a polymeric compound capable of forming a phase-separated structure can be obtained by mixing with a homopolymer as will be described later.

According to the present invention, it is possible to form a microphase-separated structure having a specific size or a specific period, which has difficulty in being prepared according to the conventional polymerization technology.

In the present invention, "incapable of forming a phase-separated structure" means not only a case where the block copolymer which includes a hydrophobic polymer block and a hydrophilic polymer block is not able to form a phase-separated structure at all, but also a state where the phase-separated structure is not formed partially.

As the block (b11) and the block (b21), a combination of blocks which are non-compatible with each other is preferably used. A combination which does not cause the phase separation may be used. Further, a combination which causes the phase separation may be used.

The present invention may be applied to a case where the phase-separated structure is not formed partially even when the combination which causes the phase separation is used, as a state being "incapable of forming a phase-separated structure".

With respect to the block (b11) and the block (b21), a combination in which a phase formed from at least one type of block among plural types of blocks constituting a block copolymer can be removed more easily from a phase formed from other types of blocks is preferable.

The blocks constituting the block copolymer may have two types or three types or more.

In the present invention, the block copolymer may be a copolymer in which partial constitutional components (blocks) other than the block (b11) and the block (b21) are further bonded to the block (b11) and the block (b21).

Examples of the block (b11) and the block (b21) include a block in which a structural unit derived from styrene or a styrene derivative is repeatedly bonded; a block in which a structural unit (structural unit derived from (α-substituted) acrylic ester) derived from acrylic ester which may a substituent which substitutes the hydrogen atom bonded to the carbon atom on the α-position is repeatedly bonded; a block in which a structural unit (structural unit derived from (α-substituted) acrylic acid) derived from acrylic acid which may have a substituent which substitutes the hydrogen atom bonded to the carbon atom on the α-position is repeatedly bonded; a block in which a structural unit derived from siloxane or a derivative thereof is repeatedly bonded; a block in which a structural unit derived from an alkyleneoxide is repeatedly bonded; a block in which a structural unit containing a silsesquioxane structure is repeatedly bonded; and the like.

Examples of the styrene derivative include a compound in which a hydrogen atom of styrene on the α-position is substituted with a substituent such as an alkyl group and a halogenated alkyl group, and a derivative of the compound. Examples of the derivative include a compound in which a substituent is bonded to a benzene ring of styrene which may have a substituent which substitutes the hydrogen atom on the α-position carbon atom. Examples of the substituent include an alkyl group having 1 to 5 carbon atoms, a halogenated alkyl group having 1 to 5 carbon atoms, and a hydroxyalkyl group.

Specifically, examples of the styrene derivative include α-methylstyrene, 2-methylstyrene, 3-methylstyrene, 4-methylstyrene, 4-t-butylstyrene, 4-n-octylstyrene, 2,4,6-trimethylstyrene, 4-methoxystyrene, 4-t-butoxystyrene, 4-hydroxystyrene, 4-nitrostyrene, 3-nitrostyrene, 4-chlorostyrene, 4-fluorostyrene, 4-acetoxyvinylstyrene, and 4-vinylbenzylchloride.

Examples of the (α-substituted) acrylic ester include an acrylic ester and an acrylic ester in which may have a substituent which substitutes the hydrogen atom bonded to the carbon atom on the α-position. Examples of the substituent include an alkyl group having 1 to 5 carbon atoms, a halogenated alkyl group having 1 to 5 carbon atoms, and a hydroxyalkyl group.

Specific examples of the (α-substituted) acrylic ester include acrylic esters such as methyl acrylate, ethyl acrylate, propyl acrylate, n-butyl acrylate, t-butyl acrylate, cyclohexyl acrylate, octyl acrylate, nonyl acrylate, hydroxyethyl acrylate, hydroxypropyl acrylate, benzyl acrylate, anthracene acrylate, glycidyl acrylate, 3,4-epoxycyclohexylmethane acrylate, and propyltrimethoxysilane acrylate; and methacrylate esters such as methyl methacrylate, ethyl methacrylate, propyl methacrylate, n-butyl methacrylate, t-butyl methacrylate, cyclohexyl methacrylate, octyl methacrylate, nonyl methacrylate, hydroxyethyl methacrylate, hydroxypropyl methacrylate, benzyl methacrylate, anthracene methacrylate, glycidyl methacrylate, 3,4-epoxycyclohexylmethane methacrylate, and propyltrimethoxysilane methacrylate.

Examples of the (α-substituted) acrylic acid include acrylic acid and acrylic acid which may have a substituent which substitutes the hydrogen atom bonded to the carbon atom on the α-position. Examples of the substituent include an alkyl group having 1 to 5 carbon atoms, a halogenated alkyl group having 1 to 5 carbon atoms, and a hydroxyalkyl group.

Specific examples of the (α-substituted) acrylic acid include acrylic acid and methacrylic acid.

Examples of siloxane or derivative thereof include dimethylsiloxane, diethylsiloxane, diphenylsiloxane, and methylphenylsiloxane.

Examples of the alkylene oxide include ethylene oxide, propylene oxide, isopropylene oxide, and butylene oxide.

As the structural unit containing a silsesquioxane structure, a polyhedral oligomeric silsesquioxane structure-containing structural unit is preferable. Examples of a monomer which provides the polyhedral oligomeric silsesquioxane structure-containing structural unit include a compound having the basket-type silsesquioxane structure and a polymeric group.

In the present invention, examples of the block copolymer include a polymeric compound obtained by bonding a block in which a structural unit derived from styrene or a styrene derivative is repeatedly bonded, and a block in which a structural unit derived from (α-substituted) acrylic ester is repeatedly bonded; a polymeric compound obtained by bonding a block in which a structural unit derived from styrene or a styrene derivative is repeatedly bonded, and a block in which a structural unit derived from (α-substituted) acrylic acid is repeatedly bonded; a polymeric compound obtained by bonding a block in which a structural unit derived from styrene or a styrene derivative is repeatedly bonded, and a block in which a structural unit derived from siloxane or a derivative thereof is repeatedly bonded; a polymeric compound obtained by bonding a block in which a structural unit derived from alkyleneoxide is repeatedly bonded, and a block in which a structural unit derived from (α-substituted) acrylic ester is repeatedly bonded; a polymeric compound obtained by bonding a block in which a structural unit derived from alkyleneoxide is repeatedly bonded, and a block in which a structural unit derived from (α-substituted) acrylic acid is repeatedly bonded; a polymeric compound obtained by bonding a block in which a polyhedral oligomeric silsesquioxane structure-containing structural unit is repeatedly bonded, and a block in which a structural unit derived from (α-substituted) acrylic ester is repeatedly bonded; a polymeric compound obtained by bonding a block in which a polyhedral oligomeric silsesquioxane structure-containing structural unit is repeatedly bonded, and a block in which a structural unit derived from (α-substituted) acrylic acid is repeatedly bonded; and a polymeric compound obtained by bonding a block in which a polyhedral oligomeric silsesquioxane structure-containing structural unit is repeatedly bonded, and a block in which a structural unit derived from siloxane or a derivative thereof is repeatedly bonded.

Among these materials, examples of the block copolymer preferably include a polymeric compound obtained by bonding a block in which a structural unit derived from styrene or a styrene derivative is repeatedly bonded, and a block in which a structural unit derived from (α-substituted) acrylic ester is repeatedly bonded; and a polymeric compound obtained by bonding a block in which a structural unit derived from styrene or a styrene derivative is repeatedly bonded, and a block in which a structural unit derived from (α-substituted) acrylic acid is repeatedly bonded. A polymeric compound obtained by bonding a block in which a structural unit derived from styrene or a styrene derivative is repeatedly bonded, and a block in which a structural unit derived from (α-substituted) acrylic ester is repeatedly bonded is more preferable. A polymeric compound obtained by bonding a block in which a structural unit derived from styrene or a styrene derivative is repeatedly bonded, and a block in which a structural unit derived from (meth)acrylic ester is repeatedly bonded is further preferable.

Specific examples of the block copolymer include a polystyrene-polymethyl methacrylate (PS-PMMA) block copolymer, a polystyrene-polyethyl methacrylate block copolymer, a polystyrene-(poly-t-butyl methacrylate) block copolymer, a polystyrene-poly methacrylate block copolymer, a polystyrene-polymethyl acrylate block copolymer, a polystyrene-polyethyl acrylate block copolymer, a polystyrene-(poly-t-butyl acrylate) block copolymer, and a polystyrene-polyacrylic acid block copolymer. Among these materials, the PS-PMMA block copolymer is particularly preferable.

The mass average molecular weight (Mw) (the polystyrene equivalent value determined by gel permeation chromatography) of each polymer constituting the block copolymer is not particularly limited as long as the mass average molecular weight has a value which may cause the phase separation. However, the mass average molecular weight of each polymer is preferably 5,000 to 500,000, more preferably 5,000 to 400,000, and further preferably 5,000 to 300,000.

Mw of the block copolymer is not particularly limited as long as Mw has a value which may cause the phase separation. However, Mw of the block copolymer is preferably 5,000 to 100,000, more preferably 20,000 to 60,000, and further preferably 30,000 to 50,000.

The molecular weight dispersivity (Mw/Mn) of the block copolymer is preferably 1.0 to 3.0, more preferably 1.0 to 1.5, and further preferably 1.0 to 1.2. Mn indicates the number average molecular weight.

The period (length of one molecule of the block copolymer) of the block copolymer is preferably 5 nm to 50 nm, more preferably 10 nm to 40 nm, and further preferably 20 nm to 30 nm.

In the present invention and the present specification, "the period of the block copolymer" means a period of a phase structure observed when the phase-separated structure is formed, and is the sum of the lengths of phases which are non-compatible with each other.

Homopolymer

In the present invention, a homopolymer compatible with the hydrophilic polymer block or a homopolymer compatible with the hydrophobic polymer block is mixed with the block copolymer.

In the present invention, a homopolymer compatible with the hydrophilic polymer block in the block copolymer may be mixed, and a homopolymer compatible with the hydrophobic polymer block in the block copolymer may be mixed.

Here, the meaning of being "compatible" includes that a polymer which has a structure similar to a homopolymer which constitutes the block (b11) or the block (b21), and may have a structure with the design being changed within a limit without departing from a range of maintaining to be compatible with the block (b11) or the block (b21).

Specifically, descriptions will be made, taking an example in which a polystyrene-polymethyl methacrylate copolymer (PS-PMMA) is provided as the block copolymer which is incapable of forming a phase-separated structure.

In this case, the homopolymer compatible with a hydrophobic polymer is a homopolymer which is compatible with the hydrophobic polymer block in the block copolymer, namely, a homopolymer having a structure similar to polystyrene. The homopolymer compatible with a hydrophilic polymer block is a homopolymer which is compatible with the hydrophilic block in the block copolymer, namely, a homopolymer having a structure similar to polymethyl methacrylate.

The homopolymer having a structure similar to polystyrene may have an appropriately-changed design as long as the homopolymer is a homopolymer compatible with the polystyrene. Specific examples of the homopolymer include α-methyl styrene in which the hydrogen atom of the polystyrene on the α-position is substituted with a methyl group.

The homopolymer having a structure similar to polymethyl methacrylate may have an appropriately-changed design as long as the homopolymer is a homopolymer compatible with the polymethyl methacrylate. Specific examples of the homopolymer include polymethyl acrylate.

With respect to the homopolymer to be used in the present invention, the homopolymer compatible with the hydrophilic polymer block is preferably the same homopolymer as a homopolymer constituting the hydrophilic polymer block in the block copolymer, and the hydrophobic homopolymer is preferably the same homopolymer as a homopolymer constituting the hydrophobic polymer block in the block copolymer.

That is, according to the example using a polystyrene-polymethyl methacrylate (PS-PMMA) copolymer as the block copolymer, it is preferable that polystyrene is employed as the hydrophobic homopolymer and polymethyl methacrylate is employed as the hydrophilic homopolymer.

By the examination of the present inventors, they have obtained a new knowledge that a resin composition for forming a phase-separated structure, which can form the phase-separated structure, can be obtained by mixing a base block copolymer incapable of forming a phase-separated structure with a homopolymer having a low molecular weight.

Controlling a phase-separated structure to have a desired pattern may be performed in the process of enabling the base block copolymer incapable of forming a phase-separated structure to form a phase-separated structure.

Thus, for example, even in a case where a block copolymer incapable of forming a phase-separated structure is produced, the produced block copolymer can be reused without being discarded.

Regarding the microphase separation of the block copolymer, it is known that a change of the volume fractional ratio of each block constituting the block copolymer causes various phase-separated structures such as a cylindrical structure, a lamellar structure, a co-continuous structure, or a spherical structure to be formed.

In the present invention, the predetermined homopolymer is mixed with a block copolymer of the hydrophobic polymer block and the hydrophilic polymer block, and thus it is possible to enable a base block copolymer incapable of forming a phase-separated structure to forma phase-separated structure by controlling the volume fractional ratio.

More specifically, for example, in a case where the block copolymer (also referred to as "the base block copolymer" below) originally does not enable formation of a separation structure, mixing the predetermined homopolymer allows the phase-separated structure to be formed so as to have the spherical structure illustrated in FIG. 2(I), the cylindrical structure illustrated in FIG. 2(II), the lamellar structure illustrated in FIG. 2(III), further, a spherical structure (FIG. 2(IV)) having a phase reverse to that of the spherical structure illustrated in FIG. 2(I), or a cylindrical structure (FIG. 2(V)) having a phase reverse to that of the cylindrical structure illustrated in FIG. 2(II). Thus, it is possible to freely perform control to form a desired phase-separated structure.

In the present invention, a homopolymer compatible with the hydrophilic polymer block may be mixed with the block copolymer, and a homopolymer compatible with the hydrophobic polymer block may be mixed with the block copolymer. Effects shown depending on whether a homopolymer to be mixed is hydrophilic or hydrophobic have no difference. However, from a viewpoint of operability, a hydrophilic homopolymer is more preferably mixed.

In the present invention, the molecular weight of a homopolymer mixed with the block copolymer is more preferably equal to or less than 5,000, and particularly preferably equal to or less than 3,000.

The molecular weight is preferably equal to or greater than 1,000, more preferably equal to or greater than 1,500, and particularly preferably equal to or greater than 2,000.

The upper limit value and the lower limit value of the molecular weight may be arbitrarily combined.

In the present invention, the molecular weight of a homopolymer mixed with the block copolymer is low molecular weight as described above, and thus the phase-separated structure is controlled well, and the phase-separated structure may be controlled in a unit of several nm to several tens nm.

The molecular weight dispersivity (Mw/Mn) of a homopolymer is preferably 1.0 to 3.0, more preferably 1.0 to 1.5, and further preferably 1.0 to 1.2. Mn indicates the number average molecular weight.

In the present invention, the total amount of the homopolymer with respect to 100 parts by mass of the block copolymer is preferably 1 part by mass to 99 parts by mass, more preferably 10 parts by mass to 80 parts by mass, and particularly preferably 20 parts by mass to 60 parts by mass.

It is considered that it is possible to form a better phase-separated structure by setting such a range.

In the present invention, the method of mixing the resin composition for forming a phase-separated structure is not particularly limited, and any conventional mixing method may be used.

In the present invention, the method of measuring the period of the phase separation of the block copolymer is not particularly limited, and examples thereof include a method of using an image analysis software such as MATLB.

If desired, other miscible additives can also be appropriately added to the resin composition for forming a phase-separated structure, in addition to the block copolymer. Examples of such miscible additives include additive resins for improving the performance of the layer of the neutralization film, surfactants for improving the applicability, dissolution inhibitors, plasticizers, stabilizers, colorants, halation inhibitors, dyes, sensitizers, base amplifiers and basic compounds.

Organic Solvent

The resin composition for forming a phase-separated structure may be prepared by dissolving the block copolymer and the homopolymer in an organic solvent. The organic solvent may be any organic solvent which can dissolve the respective components to give a uniform solution, and one or more kinds of any organic solvent can be appropriately selected from those which have been conventionally known as solvents for a film composition containing a resin as a main component.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (for example, monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or in combination as a mixed solvent.

Among these materials, propylene glycol monomethyl ether acetate (PGMEA), propylene glycol monomethyl ether (PGME), cyclohexanone and ethyl lactate (EL) are preferable.

Further, among the mixed solvents, a mixed solvent obtained by mixing PGMEA with a polar solvent is preferable. The mixing ratio (mass ratio) of the mixed solvent can be appropriately determined, taking into consideration the compatibility of the PGMEA with the polar solvent, but is preferably in the range of 1:9 to 9:1, more preferably from 2:8 to 8:2. For example, when EL is mixed as the polar solvent, the PGMEA:EL mass ratio is preferably from 1:9 to 9:1, and more preferably from 2:8 to 8:2. Alternatively, when PGME is mixed as the polar solvent, the PGMEA:

PGME mass ratio is preferably from 1:9 to 9:1, more preferably from 2:8 to 8:2, and still more preferably 3:7 to 7:3. Alternatively, when PGME and cyclohexanone is mixed as the polar solvent, the PGMEA:(PGME+cyclohexanone) mass ratio is preferably from 1:9 to 9:1, more preferably from 2:8 to 8:2, and still more preferably 3:7 to 7:3.

The amount of the organic solvent in the resin composition for forming a phase-separated structure is not particularly limited, and is adjusted appropriately to a concentration that enables application of a coating solution depending on the thickness of the coated film. In general, the organic solvent is used in an amount such that a solid content concentration of the block copolymer is within a range of 0.2 to 70% by mass, and preferably 0.2 to 50% by mass.

Hereafter, among the blocks constituting the block copolymer, in an optional step described later, a block which is not selectively removed is referred to as "block $P_A$", and a block to be selectively removed is referred to as "block $P_B$". For example, after the phase separation of a layer containing a PS-PMMA block copolymer, by subjecting the layer to an oxygen plasma treatment or a hydrogen plasma treatment, the phase of PMMA is selectively removed. In such a case, PS is the block $P_A$, and PMMA is the block $P_B$.

A method of producing a structure containing the phase-separated structure according to the present invention preferably includes a step of applying a neutralization film onto a substrate so as to form a layer of the neutralization film, a step of forming a layer which contains a resin composition for forming a phase-separated structure, on the layer of the neutralization film, a step of phase-separating the layer which contains the resin composition for forming the phase-separated structure, and an optional step which will be described later.

Step of Applying Neutralization Film onto Substrate to Form a Layer of a Neutralization Film First, a neutralization film containing a surface treating agent is formed on a substrate.

Substrate

There are no particular limitations on the type of the substrate, provided that the resin composition for forming a phase-separated structure can be coated on the surface of the substrate. Examples of the substrate include a substrate formed of an inorganic substance such as a metal (for example, silicon, copper, chromium, iron or aluminum), glass, titanium oxide, silica or mica; and a substrate formed of an organic substance such as an acrylic plate, polystyrene, cellulose, cellulose acetate or a phenol resin.

Further, the size and the shape of the substrate used in the present invention is not particularly limited. The substrate does not necessarily need to have a smooth surface, and a substrate made of various materials and having various shapes can be appropriately selected for use. For example, various shapes can be used, such as a substrate having a curved surface, a plate having an uneven surface, and a thin sheet.

Further, on the surface of the substrate, an inorganic and/or organic film may be provided. As the inorganic film, an inorganic antireflection film (inorganic BARC) can be used. As the organic film, an organic antireflection film (organic BARC) can be used.

Before forming a neutralization film on the substrate, the surface of the substrate may be washed. By washing the surface of the substrate, the later neutralization film forming step may be satisfactorily performed.

As the washing treatment, a conventional method may be used, and examples thereof include an oxygen plasma treatment, a hydrogen plasma treatment, an ozone oxidation treatment, an acid alkali treatment, and a chemical modification treatment. For example, the substrate is immersed in an acidic solution such as a sulfuric acid/hydrogen peroxide aqueous solution, followed by washing with water and drying. Thereafter, a layer containing the resin composition for forming a phase-separated structure can be formed on the surface of the substrate.

Neutralization Film Forming Step

In the present invention, firstly, the substrate is preferably subjected to a neutralization treatment. The neutralization treatment is a treatment in which the surface of the substrate is modified so as to have affinity for all the polymers constituting the block copolymer. By the neutralization treatment, it becomes possible to prevent only a phase of a specific polymer from coming into contact with the surface of the substrate by phase separation. For this reason, in order to form a phase-separated structure having a lamellar structure oriented in a direction perpendicular to the substrate surface, before forming a layer containing a block copolymer, it is preferable to form a layer of the neutralization film on the substrate surface depending on the type of the block copolymer to be used.

Specifically, a thin film (neutralization film) containing a surface treating agent having affinity for all the polymers constituting the block copolymer is formed on the surface of the substrate.

As the neutralization film, a film composed of a resin composition can be used. The resin composition used as the surface treating agent can be appropriately selected from conventional resin compositions used for forming a thin film, depending on the type of polymers constituting the block copolymer. The resin composition used as the surface treating agent may be a heat-polymerizable resin composition, or a photosensitive resin composition such as a positive-type resist composition or a negative-type resist composition.

Alternatively, a compound may be used as the surface treating agent, and the compound may be coated to form a non-polymerizable film as the neutralization film. For example, a siloxane organic monomolecular film formed by using a surface treating agent such as phenethyltrichlorosilane, octadecyltrichlorosilane or hexamethyldisilazane may be preferably used as a neutralization film.

The neutralization film composed of the surface treating agent can be formed by a conventional method.

Examples of the surface treating agent include a resin composition containing all the structural units of the polymers constituting the block copolymer, and a resin containing all the structural units having high affinity for the polymers constituting the block copolymer.

For example, when the aforementioned PS-PMMA block copolymer is used, as the surface treating agent, it is preferable to use a resin composition containing both PS and PMMA as the structural units, or a compound or a composition, each containing both a portion having a high affinity for PS such as an aromatic ring and a portion having a high affinity for PMMA such as a functional group with high polarity.

Examples of the resin composition containing both PS and PMMA as the structural units include a random copolymer of PS and PMMA, and an alternating polymer of PS and PMMA (a copolymer in which the respective monomers are alternately copolymerized).

Examples of the composition containing both a portion having a high affinity for PS and a portion having a high affinity for PMMA include a resin composition obtained by polymerizing at least a monomer having an aromatic ring and a monomer having a substituent with high polarity. Examples of the monomer having an aromatic ring include a monomer having a group in which one hydrogen atom is removed from the ring of an aromatic hydrocarbon, such as a phenyl group, a biphenyl group, a fluorenyl group, a naphthyl group, an anthryl group or a phenanthryl group, or a monomer having a hetero aryl group such as the aforementioned group in which part of the carbon atoms constituting the ring of the group is substituted with a hetero atom such as an oxygen atom, a sulfur atom or a nitrogen atom. Examples of the monomer having a substituent with high polarity include a monomer having a trimethoxysilyl group, a trichlorosilyl group, a carboxy group, a hydroxy group, a cyano group or a hydroxyalkyl group in which part of the hydrogen atoms of the alkyl group is substituted with a fluorine atom.

In addition, examples of the compound containing both a portion having a high affinity for PS and a portion having a high affinity for PMMA include a compound having both an aryl group such as a phenethyltrichlorosilane and a substituent with high polarity, and a compound having both an alkyl group and a substituent with high polarity, such as an alkylsilane compound.

In the present embodiment, as described later, a pattern of a photosensitive resin may be formed on the neutralization film. Therefore, in consideration of the adhesiveness of the pattern, it is preferred that the neutralization film exhibits a polarity close to that of the photosensitive resin composition.

Step of Forming Layer Containing Resin Composition for Forming Phase-Separated Structure on the Layer of the Neutralization Film In the present invention, after the previous step (step of applying a neutralization film to a substrate to form a layer of the neutralization film), it is preferable to form a layer of the resin composition for forming a phase-separated structure on the layer of the neutralization film.

Specifically, the resin composition for forming a phase-separated structure, which is dissolved in a suitable organic solvent, is applied to the neutralization film using a spinner or the like.

Step of Phase-Separating a Layer Containing a Resin Composition for Forming a Phase-Separated Structure After the step (step of forming a layer containing a resin composition for forming a phase-separated structure), the layer on the neutralization film, which contains the resin composition for forming a phase-separated structure is preferably phase-separated.

The phase-separation of the layer containing the resin composition for forming a phase-separated structure (layer 3 is FIG. 1) is performed by heat treatment after the formation of the layer containing the resin composition for forming a phase-separated structure, thereby forming a phase-separated structure. The heat treatment is preferably conducted at a temperature at least as high as the glass transition temperature of the layer containing the mixture of the block copolymer used and lower than the thermal decomposition temperature. For example, in the case where the block copolymer is PS-PMMA (Mn: 150,000 to 50,000), the heat treatment is preferably conducted at 150° C. to 270° C., more preferably 200° C. to 250° C., and most preferably 210° C. to 230° C. The heat treatment time is preferably 30 to 3,600 seconds, and more preferably 120 to 600 seconds.

The heat treatment is preferably conducted in a low reactive gas such as nitrogen.

By the above heat treatment, a structure containing a phase-separated structure in which the layer containing resin composition for forming phase-separated structure is phase-separated into a phase of $P_A$ block and a phase of $P_B$ block can be obtained.

By conducting the above steps, a structure containing a phase-separated structure formed along the photosensitive resin pattern can be obtained. That is, according to the present embodiment, it is considered that the orientation of the phase-separated structure becomes controllable.

In the present embodiment, a method in which a photosensitive resin composition or the like is used as a physical guide to control the orientation of the phase-separated pattern (graphoepitaxy) may be used.

Optional Step

In the present invention, after the step of phase-separating the layer containing the resin composition for forming a phase-separated structure, a pattern may be formed by selectively removing a phase of at least one type block of the plurality of types of blocks constituting the block copolymer from the layer containing the resin composition for forming a phase-separated structure.

Specifically, for example, after forming a phase-separated structure, at least a portion of the block within the $P_B$ block phase (phase 3a in FIG. 1) is selectively removed (decomposition into low molecules) from the layer containing resin composition for forming a phase-separated structure on the substrate so as to form a pattern. By selectively removing a portion of the $P_B$ block in advance, the solubility in a developing solution can be enhanced. As a result, the phase formed of the $P_B$ block can be more reliably removed by selective removing than the phase formed of the $P_A$ block.

The selective removal treatment is not particularly limited, as long as it is a treatment capable of decomposing and removing the $P_B$ block without affecting the $P_A$ block. The selective removal treatment can be appropriately selected from any methods for removing a resin film, depending on the types of the $P_A$ block and the $P_B$ block. Further, when a neutralization film is formed on the surface of the substrate in advance, the neutralization film is removed together with the phase of the $P_B$ block. Examples of the removal treatment include an oxygen plasma treatment, an ozone treatment, a UV irradiation treatment, a thermal decomposition treatment and a chemical decomposition treatment.

The substrate having a pattern formed by the phase-separation of the layer containing the resin composition for forming phase-separated structure as described above may be used as it is, or a further heat treatment may be conducted to modify the shape of the polymeric nano structure on the substrate. The heat treatment is preferably conducted at a temperature at least as high as the glass transition temperature of the block copolymer used and lower than the thermal decomposition temperature. Further, the heat treatment is preferably conducted in a low reactive gas such as nitrogen.

Resin Composition for Forming Phase-Separated Structure

According to a second aspect of the present invention, there is provided a resin composition for forming a phase-separated structure. The resin composition contains a block copolymer which includes a hydrophobic polymer block and a hydrophilic polymer block and is incapable of forming a phase-separated structure, and a homopolymer compatible with the hydrophilic polymer block or a homopolymer compatible with the hydrophobic polymer block. Descriptions for the resin composition for forming a phase-separated structure according to the present invention are similar to the descriptions regarding the resin composition for forming a phase-separated structure, which is described as a composition which can be appropriately used in the method of producing a structure containing a phase-separated structure according to the first aspect of the present invention.

The molecular weight of a homopolymer mixed with the block copolymer is preferably equal to or less than 5,000, and more preferably equal to or less than 3,000.

The molecular weight is preferably equal to or greater than 1,000, more preferably equal to or greater than 1,500, and particularly preferably equal to or greater than 2,000.

The upper limit value and the lower limit value of the molecular weight may be arbitrarily combined.

In the present invention, the molecular weight of a homopolymer mixed with the block copolymer is low molecular weight as described above, and thus the phase-separated structure is controlled well, and the phase-separated structure may be controlled in a unit of several nm to several tens nm.

In the resin composition for forming a phase-separated structure according to the present invention, the hydrophilic homopolymer is preferably formed from the same structural unit as the structural unit constituting the hydrophilic polymer block.

In the resin composition for forming a phase-separated structure according to the present invention, the hydrophobic homopolymer is preferably formed from the same structural unit as the structural unit constituting the hydrophobic polymer block.

In the resin composition for forming a phase-separated structure according to the present invention, the block copolymer is preferably a polystyrene-polymethyl methacrylate block copolymer.

Phase-Separated Structure Control Method

As an aspect of the present invention, a phase-separated structure control method may be provided. The phase-separated structure control method is a method in which a homopolymer compatible with the hydrophilic polymer block or a homopolymer compatible with the hydrophobic polymer block is mixed with a block copolymer which includes the hydrophobic polymer block and the hydrophilic polymer block, and thereby controlling the phase-separated structure.

Figure 2:
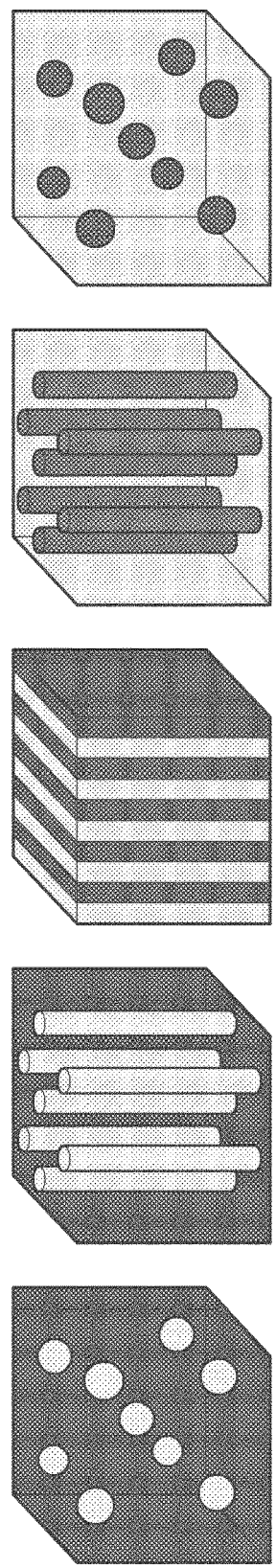
FIG. 2 is a diagram illustrating an example of a phase-separated state.

In this specification, "a method of controlling a phase-separated structure" refers to a method of freely controlling the phase-separated structure to be formed so as to have a desired structure, for example, the cylindrical structure illustrated in FIG. 2(II), the lamellar structure illustrated in FIG. 2(III), further, a spherical structure (FIG. 2(IV)) having a phase reverse to that of the spherical structure illustrated in FIG. 2(I), or a cylindrical structure (FIG. 2(V)) having a phase reverse to that of the cylindrical structure illustrated in FIG. 2(II).

In the phase-separated structure control method, as the block copolymer used as a base, a material which enables formation of the phase-separated structure may be used or a material which does not allow formation of the phase-separated structure may be used.

According to the phase-separated structure control method of the present invention, it is possible to form a microphase-separated structure having a specific size or specific a period, which has difficulty in being obtained according to the conventional polymerization technology. For example, even in a case where a block copolymer incapable of forming a phase-separated structure is produced, the produced block copolymer can be reused without being discarded.

Regarding the phase-separated structure control method of the present invention, the descriptions for the block copolymer and the homopolymer are similar to the descriptions for the method of producing a structure containing a phase-separated structure according to the first aspect of the present invention.

In the phase-separated structure control method of the present invention, a homopolymer compatible with the hydrophilic polymer block may be mixed with the block copolymer, and a homopolymer compatible with the hydrophobic polymer block may be mixed with the block copolymer. Effects shown depending on whether the homopolymer to be mixed is hydrophilic or hydrophobic have no difference. However, control to form a desired phase-separated structure may be performed depending on the type or the mixed amount of a homopolymer to be mixed.

EXAMPLES

The present invention will be described more specifically with reference to the following examples, although the scope of the present invention is by no way limited by these examples.

Examples 1 to 8

Step A

A PS-PMMA block copolymer (Mn: 157,300, Mw/Mn: 1.03, PS: 0.79% by mass, PMMA: 0.21% by mass) was employed as the block copolymer of the hydrophobic polymer block and the hydrophilic polymer block. This PS-PMMA block copolymer and a PMMA homopolymer (Mn: 2,000, Mw/Mn: 1.06, Homo-methyl methacrylate (below described as "Homo-PMMA") were dissolved in a solvent (PGMEA), and thereby preparing a resin composition solution for forming a phase-separated structure.

TABLE 1

|  | HOMO-PMMA addition amount (% by mass) | St/PMMA (% by mass) |
| --- | --- | --- |
| Example 1 | 10 | 0.72/0.28 |
| Example 2 | 20 | 0.66/0.34 |
| Example 3 | 30 | 0.61/0.39 |
| Example 4 | 40 | 0.56/0.44 |
| Example 5 | 50 | 0.53/0.47 |
| Example 6 | 60 | 0.49/0.51 |
| Example 7 | 70 | 0.46/0.54 |
| Example 8 | 80 | 0.44/0.56 |
| Reference example 1 | — | 0.79/0.21 |

Step B

To an 8-inch silicon wafer, as a neutralization film, a resin composition (a copolymer of styrene/3,4-epoxycyclohexylmethyl methacrylate/propyltrimethoxysilane methacrylate=88/17/5 with Mw=43,400 and Mw/Mn=1.77) adjusted to a concentration of 0.5 to 1.0% by mass with PGMEA was applied using a spinner, followed by baking at 250° C. for 60 seconds and dried, thereby forming a layer of the neutralization film with a film thickness of 90 nm on the substrate.

Then, portions of the neutralization film other than the portion adhered to the substrate were removed by a solvent (PGMEA). Then, on the layer of the neutralization film, a PGMEA solution (2% by mass) of a resin composition for forming a phase-separated structure (Examples 1 to 8, Reference example 1) was spin-coated (number of rotation: 1,500 rpm, 60 seconds).

The coated film thickness of the layer of the resin composition for forming a phase-separated structure was set to 30 nm.

The layer of the resin composition for forming a phase-separated structure was soft baked at 90° C. for 60 seconds. Then, the substrate having the layer of the resin composition for forming a phase-separated structure coated thereon was heated at 210° C. or 230° C. for 300 seconds while flowing nitrogen for annealing, thereby forming a phase-separated structure.

As a result, in Examples 1 to 8 in which Homo-PMMA was added, it was possible to form the lamellar structure or the cylindrical structure.

TABLE 2

| Example 1 | formation of cylindrical structure |
| Example 2 | formation of cylindrical structure |
| Example 3 | formation of cylindrical structure |
| Example 4 | formation of lamellar structure |
| Example 5 | formation of lamellar structure |
| Example 6 | formation of lamellar structure |
| Example 7 | formation of cylindrical structure |
| Example 8 | formation of cylindrical structure |
| Reference example 1 | impossibility of formation of phase-separated structure |

As represented by the above result, in Reference example 1 in which only a base block copolymer is used, forming the phase-separated structure was impossible. However, in Examples 1 to 8 in which Homo-PMMA is added to the base block copolymer, it was possible to form the phase-separated structure, to form a cylindrical structure or a lamellar structure as the phase-separated structure, and to obtain a desired phase separation pattern.

In this example, Homo-PMMA compatible with the hydrophilic polymer block is added. However, it is sufficiently presumed that the similar effect can be also obtained in a case where a homopolymer compatible with the hydrophobic polymer block is mixed with the base block copolymer.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of producing a structure containing a phase-separated structure, the method comprising:
   forming a layer of a neutralization film on a substrate,
   forming a layer of a resin composition for forming phase-separated structure on the layer of the neutralization film, and
   phase-separating the layer of the resin composition for forming phase-separated structure,
   wherein the resin composition for forming phase-separated structure is prepared by mixing a block copolymer, which includes a polystyrene block and a polymethyl methacrylate block, with a polystyrene homopolymer or a polymethyl methacrylate, homopolymer
   wherein the block copolymer is incapable of forming a phase-separated structure, provided that the block copolymer is dissolved in propylene glycol monomethyl ether acetate to prepare a composition, the composition is applied to the neutralization film on the substrate to form a layer of the composition, the layer of the composition is soft baked at 90° C. for 60 seconds and the layer of the composition is heated at 210 to 230° C. for 300 seconds while flowing nitrogen for annealing.

2. The method of producing a structure containing a phase-separated structure according to claim 1, wherein the homopolymer has a number average molecular weight of 5,000 or less.

3. A resin composition for forming a phase-separated structure, comprising:
   a block copolymer which includes a polystyrene block and a polymethyl methacrylate block; and
   a polystyrene homopolymer or a polymethyl methacrylate homopolymer,
   wherein the block copolymer is incapable of forming a phase-separated structure, provided that the block copolymer is dissolved in propylene glycol monomethyl ether acetate to prepare a composition, the composition is applied to the neutralization film on the substrate to form a layer of the composition, the layer of the composition is soft baked at 90° C. for 60 seconds and the layer of the composition is heated at 210 to 230° C. for 300 seconds while flowing nitrogen for annealing.

4. The resin composition for forming a phase-separated structure according to claim 3, wherein the homopolymer has a number average molecular weight of 5,000 or less.

* * * * *